(12) United States Patent
Battaglia, Jr. et al.

(10) Patent No.: US 8,409,898 B1
(45) Date of Patent: Apr. 2, 2013

(54) ASSEMBLY SYSTEM FOR PHOTOVOLTAIC PACKAGES

(75) Inventors: Douglas R. Battaglia, Jr., Campbell, CA (US); Ziehl-Neelsen L. Co, Pleasanton, CA (US)

(73) Assignee: Solaria Corporation, Fremont, CA (US)

( * ) Notice: Subject to any disclaimer, the term of this patent is extended or adjusted under 35 U.S.C. 154(b) by 234 days.

(21) Appl. No.: 12/887,954

(22) Filed: Sep. 22, 2010

(51) Int. Cl.
*H01L 21/00* (2006.01)
(52) U.S. Cl. .............. 438/48; 438/64; 438/66; 257/21; 257/E27.124
(58) Field of Classification Search ............ 257/21, 257/22, E27.124, E27.125; 438/48, 64, 66
See application file for complete search history.

(56) References Cited

U.S. PATENT DOCUMENTS 5,470,396 A * 11/1995 Mongon et al. ............... 136/251
2007/0221919 A1 * 9/2007 Sato et al. ...................... 257/44

* cited by examiner

*Primary Examiner* — Thinh T Nguyen
(74) *Attorney, Agent, or Firm* — Richard T. Ogawa; Ogawa P.C.

(57) ABSTRACT

Assembly system for photovoltaic packages. According an embodiment, the present invention provides a system for assembling photovoltaic packages. The system includes a base plate member, which comprises a plurality of coupling elements. The plurality of coupling elements are characterized by a first length. The plurality of coupling elements is aligned according to a predetermined configuration. The plurality of coupling elements includes first and second coupling elements. The system also includes a top plate member, which includes a plurality of openings and a plurality of locator elements. The plurality of openings is characterized by a second length. The second length is greater than the first length. The openings and the locator elements are aligned according to the first predetermined configurations. The top plate member is disengageably coupled to the base plate member by the coupling elements and the openings.

4 Claims, 9 Drawing Sheets

ASSEMBLY SYSTEM FOR PHOTOVOLTAIC PACKAGES

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to photovoltaic systems and manufacturing processes and apparatus thereof. More specifically, embodiments of the present invention are related to assembly system and processes for manufacturing solar panels that comprise concentrator element and photovoltaic strips. In various embodiments, the present invention provides structures for aligning and holding photovoltaic strips. There are other embodiments as well.

As the population of the world has increased, industrial expansion has led to a corresponding increased consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

In addition to oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many desirable characteristics; it is renewable, clean, abundant, and often widespread. Certain technologies developed often capture solar energy, concentrate it, store it, and convert it into other useful forms of energy.

Solar panels have been developed to convert sunlight into energy. For example, solar thermal panels are used to convert electromagnetic radiation from the sun into thermal energy for heating homes, running certain industrial processes, or driving high grade turbines to generate electricity. As another example, solar photovoltaic panels are used to convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of costly photovoltaic silicon bearing wafer materials, which are often difficult to manufacture efficiently on a large scale, and sources can be limited.

Concentrated solar panel designs reduces the amount of photovoltaic material needed for manufacturing solar panels. If not implemented efficiently, the costs saving from photovoltaic material can be offset by manufacturing costs. Therefore, it is desirable to have novel system and method for manufacturing solar panels.

BRIEF SUMMARY OF THE INVENTION

The present invention is directed to photovoltaic systems and manufacturing processes and apparatus thereof. More specifically, embodiments of the present invention are related to assembly system and processes for manufacturing solar panels that comprise concentrator element and photovoltaic strips. In various embodiments, the present invention provides structures for aligning and holding photovoltaic strips. There are other embodiments as well.

According an embodiment, the present invention provides a system for assembling photovoltaic packages. The system includes a base plate member, which comprises a plurality of coupling elements. The plurality of coupling elements are characterized by a first length. The plurality of coupling elements is aligned according to a predetermined configuration. The plurality of coupling elements includes first and second coupling elements. The system also includes a top plate member, which includes a plurality of openings and a plurality of locator elements. The plurality of openings is characterized by a second length. The second length is greater than the first length. The openings and the locator elements are aligned according to the first predetermined configurations. The top plate member is disengageably coupled to the base plate member by the coupling elements and the openings. The system also includes a first photovoltaic assembly, which comprises photovoltaic strips and a first bus member. The first photovoltaic assembly is positioned over the a first locator element on the top plate member. The first photovoltaic assembly is aligned according to the predetermined configuration. The system additionally includes a magnetic holding element comprising a magnetic element and a handle element. The magnetic element is positioned over the first photovoltaic assembly and magnetically coupled to the first locator.

According to another embodiment, the present invention provides a system for assembling photovoltaic packages. The system includes an assembly plate, which includes a plurality of locator elements and a plurality of alignment members. The alignment member are spaced according to a photovoltaic cell configuration. The assembly plate comprises a plurality of locator elements. The locator elements are aligned and spaced according to a predetermined configuration. The locator elements includes a first locator element. The locator elements comprising metal material. The system additionally includes a holding device that includes a holding element and a handle element. The holding element is magnetically coupled to the first locator element.

According to yet another embodiment, the present invention provides a method for manufacturing a photovoltaic panel. The method includes providing a base plate member, which comprises a plurality of coupling members. The plurality of coupling members are spaced and aligned according to a first configuration. The method also includes providing a top plate member, which includes a plurality of opening and a plurality of locator elements. The openings are spaced and aligned according to a second configuration. The method further includes determining positions for coupling the coupling members into the openings. The method also includes inserting the coupling members into the openings according to the positions. The method additionally includes providing a photovoltaic assembly that has a plurality of photovoltaic strips. The method includes placing the photovoltaic assembly on a predetermine position on the top plate member. The method also includes providing a holding device. In addition, the method includes securing the photovoltaic assembly between the holding device and a first locator on the top plate member.

Many benefits can be achieved by ways of the present invention. For example, the present solar module provides an assembly system for a manufacturing process. Among other features, assembly systems according to the present invention makes it easier to manufacture, transport, and/or store partially processed solar panels. For example, partially processes photovoltaic assembles comprising multiple photovoltaic strips can be aligned and secured onto an assembly according to the present invention. In certain embodiments, assembly systems are adjustable and flexible, thereby capable of accommodating different types of concentrator structures or photovoltaic assemblies. Additionally, various embodiments according to the present invention are compatible with conventional equipment. There are other benefits as well.

A further understanding of the nature and advantages of the present invention may be realized by reference to the remaining portions of the specification and the drawings.

DETAILED DESCRIPTION OF THE INVENTION

Embodiments of the present invention provide system and methods for manufacturing concentrated solar panels. Embodiments of the present invention use concentrator elements to reduce the amount of photovoltaic material required, thereby reducing overall cost. It is noted that specific embodiments are shown for illustrative purposes, and represent examples. One skilled in the art would recognize other variations, modifications, and alternatives.

According to embodiments of the present invention, a concentrated solar module comprises a concentrator member, which includes a number of concentrator strips arranged in parallel. A number of small sized photovoltaic cells, each having a number of photovoltaic strips connected by one or more buses, are assemble into a large photovoltaic package that contains photovoltaic strips aligned against the concentrators strips. As described below, embodiments of the present invention provides adjustable assembly system for assembling and integrating photovoltaic cells.

Although orientation is not a part of the invention, it is convenient to recognize that a solar module has a side that faces the sun when the module is in use, and an opposite side that faces away from the sun. Although, the module can exist in any orientation, it is convenient to refer to an orientation where "upper" or "top" refer to the sun-facing side and "lower" or "bottom" refer to the opposite side. Thus an element that is said to overlie another element will be closer to the "upper" side than the element it overlies.

Figure 1:
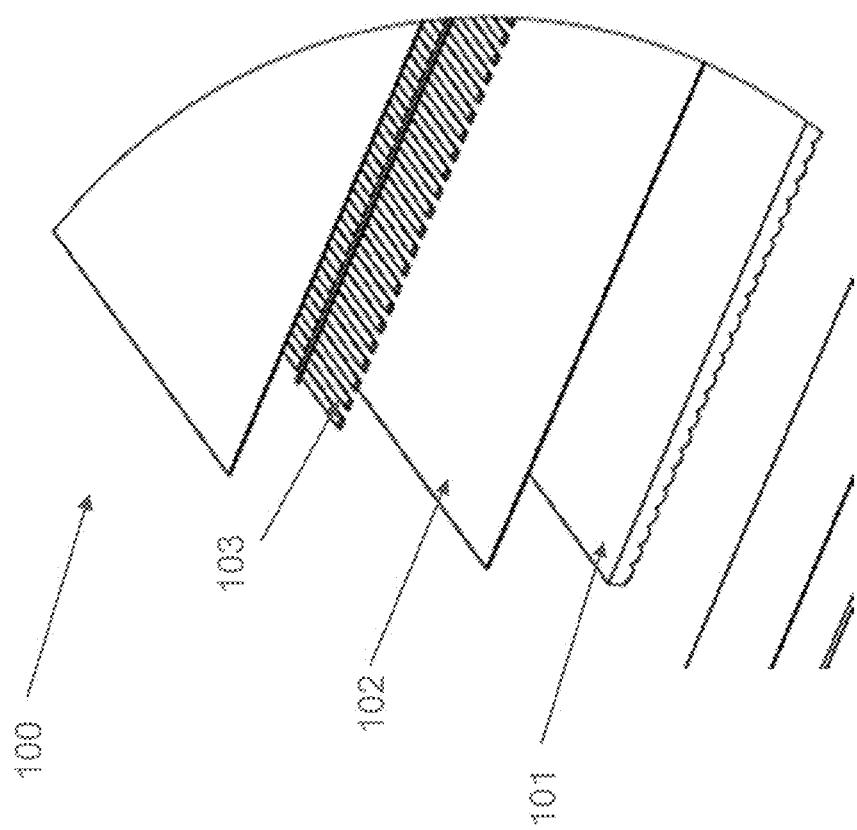
FIG. 1 is a simplified diagram illustrating a concentrated photovoltaic module.

FIG. 1 is a simplified diagram illustrating a concentrated photovoltaic module. This diagram is merely an example, which should not unduly limit the scope of the claims. One of ordinary skill in the art would recognize many variations, alternatives, and modifications. As shown in FIG. 1, a photovoltaic module 100 includes a concentrator structure that includes a number of concentrator strips that are aligned against the photovoltaic strips of the photovoltaic package 103. For example, the photovoltaic module shown in FIG. 1 is described in U.S. patent application Ser. No. 12/709,438, filed Feb. 19, 2010, and U.S. Provisional Patent Application 61/300,434, filed Feb. 1, 2010, both of which are herein incorporated by reference for all purposes.

In various embodiments, the concentrator structure is formed with a plurality of elongated concentrator elements (sometimes referred to as lens elements) that extend along the longitudinal direction of the photovoltaic strips. For at least those embodiments where the concentrator elements lie in a common plane, their center-to-center spacing is nominally equal to that of the photovoltaic strips. Each concentrator element extends longitudinally along the direction of a given strip and transversely across the direction of the strips. A given concentrator element is formed so that parallel light incident on the top surface of the concentrator element, when it reaches the plane of the underlying photovoltaic strip, is confined to a region that has a transverse dimension that is smaller than that of the concentrator element, and possibly also smaller than that of the photovoltaic strip. In the illustrated embodiments, the concentration occurs at the upper surface, although it is also possible to have the concentration occur at the lower surface of the concentrator. Indeed, as in the case of normal lenses, it is possible to have both surfaces provide concentration.

It is common to refer to the concentrator element as providing magnification, since the photovoltaic strip, when viewed through the concentrator element, appears wider than it is. Put another way, when viewed through the concentrator element, the photovoltaic strip preferably fills the concentrator element aperture. Thus, from the point of view of incoming sunlight, the solar module appears to have photovoltaic material across its entire lateral extent.

Although the term magnification is used, it is used in the sense of how much the light is concentrated, and so could equally be referred to as concentration. The magnification/concentration is also sometimes defined as the amount of photovoltaic material saved, and that number is typically less than the optical magnification/concentration since the photovoltaic strips will normally a slightly wider than the width of the light, especially to capture light incident at different angles. The term magnification will typically be used.

The portion of the surface of the concentrator element that provides the magnification has a cross section that can include one or more circular, elliptical, parabolic, or straight segments, or a combination of such shapes. Even though portions of the magnifying (typically upper) surface of the concentrator elements can be flat, it is convenient to think of, and refer to, the magnifying surface as convex, i.e., curved or arch-like. For embodiments where the cross section is semicircular, the surface of the magnifying portion of the concentrator element is semi-cylindrical. However, circular arcs subtending less than 180° are typically used. Although the convex surfaces were referred to as "annular" portions in the above-cited U.S. Patent Application No. 61/154,357, the "annular" nomenclature will not be used here. In some embodiments, the concentrator structure is extruded glass, although other fabrication techniques (e.g., molding) and other materials (e.g., polymers) can be used.

Figure 2:
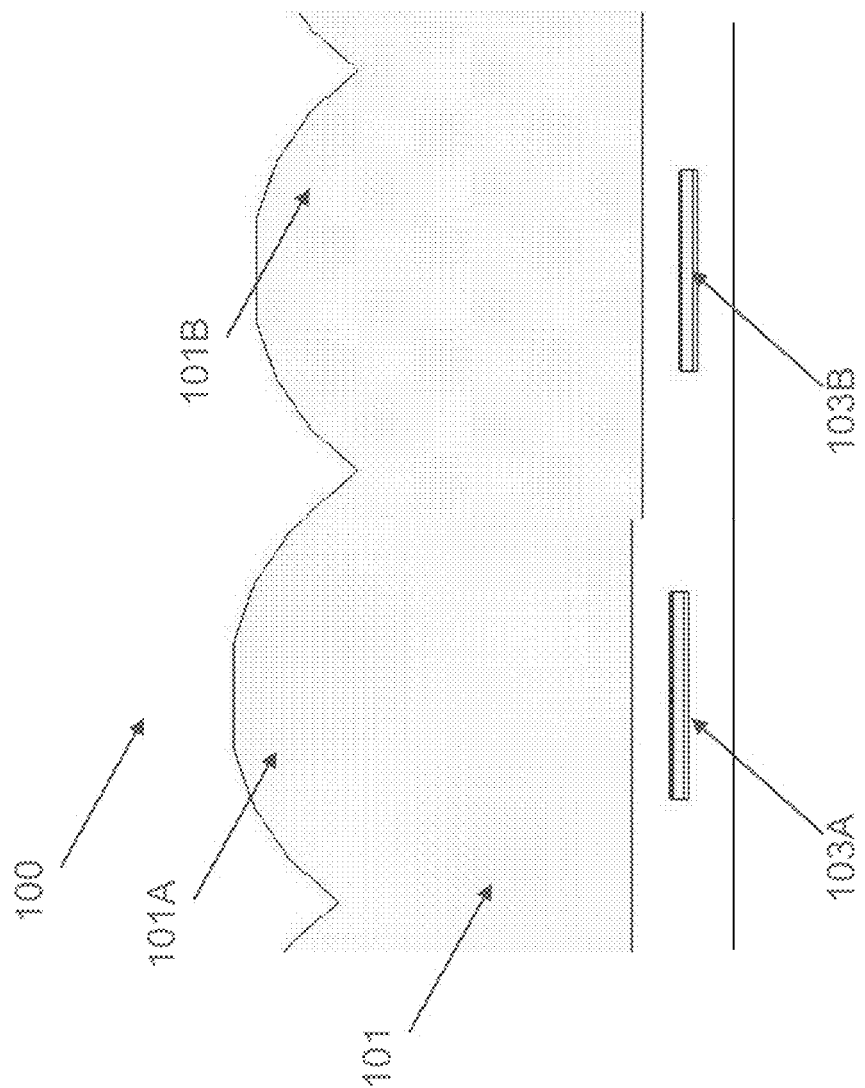
FIG. 2 is a simplified diagram illustrating a photovoltaic device.

FIG. 2 is a simplified diagram illustrating a photovoltaic device. A side view of photovoltaic module 100 shown in FIG. 2 includes concentrators 101A and 101B. As an example, the photovoltaic strips 103A and 103B are a part of a photovoltaic assembly and coupled to each other by a bus. As seen from FIG. 2, the photovoltaic strips 103A and 103B are respectively aligned against the concentrators 101A and 101B. For example, the concentrator 101A needs to be aligned to a position essentially directly above the photovoltaic strip 103A so that light from the concentrator 101A can be properly directed to the photovoltaic strip 103A.

In various manufacturing processes, the concentrator element 101 may not be perfectly aligned or evenly spaced during to manufacturing variations. For example, the concentrator element 101 includes a large piece of glass material that contains multiple concentrator strips (e.g., concentrators 101A and 101B). Typically, it's easier to align concentrator and photovoltaic strips by adjusting alignment and/or placement of photovoltaic strips. For example, photovoltaic strips 103A and 103B can be moved closer or further apart based on the positions of concentrators 101A and 101B.

Typically, the concentrator element 101 has a large area and is in a single-piece construction. Photovoltaic assemblies, on the other hand, are smaller pieces. For example, the photovoltaic module 100 illustrated in FIG. 1 comprises an integrated piece of concentrator element 101 and the photovoltaic package 103 that is assembled from a number of photovoltaic assemblies.

Figure 3:
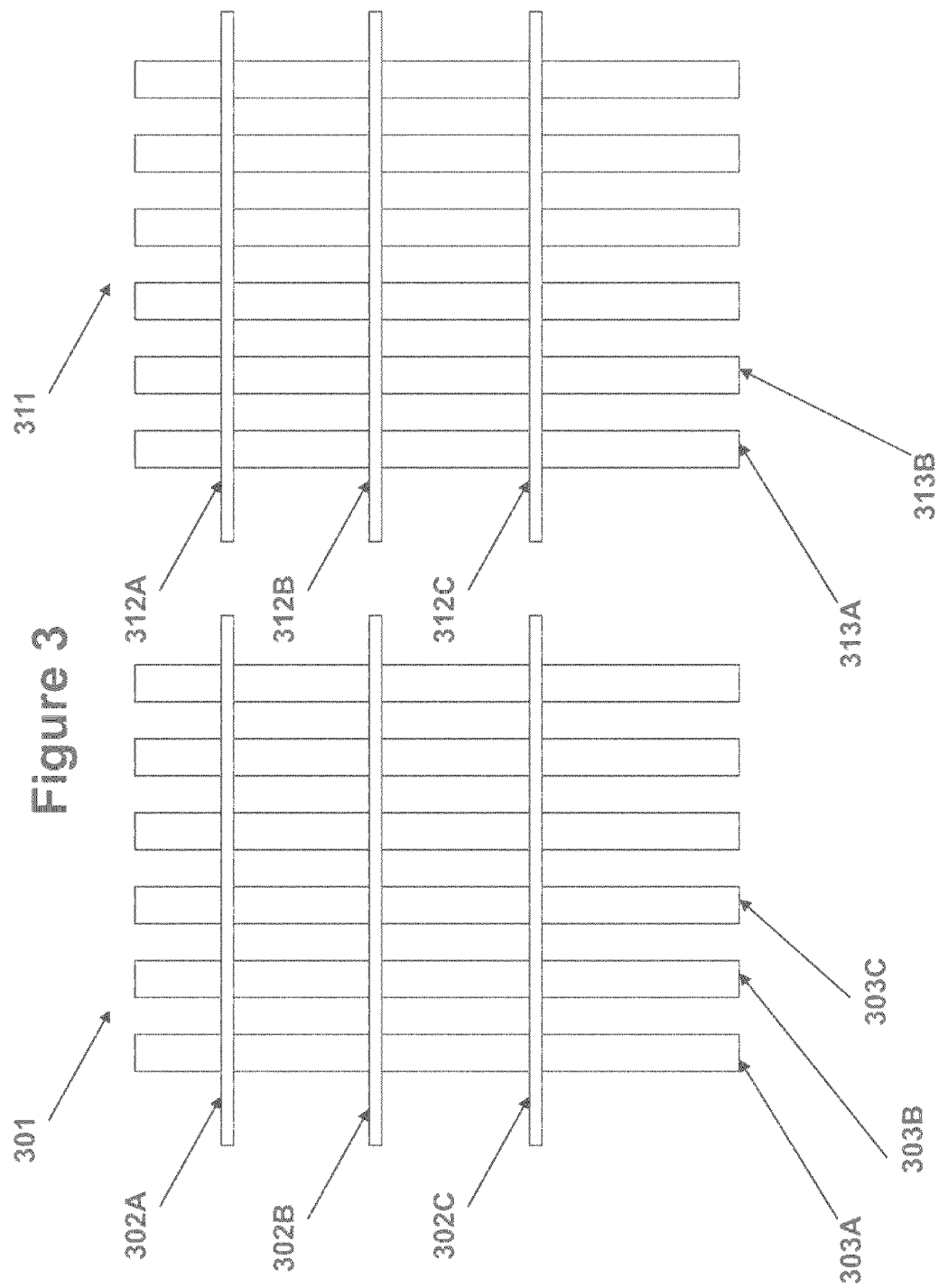
FIG. 3 is a simplified diagram illustrating photovoltaic assemblies according to an embodiment of the present invention.

FIG. 3 is a simplified diagram illustrating photovoltaic assemblies according to an embodiment of the present invention. This diagram is merely an example, which should not unduly limit the scope of the claims. One of ordinary skill in the art would recognize many variations, alternatives, and modifications. As an example, photovoltaic assemblies 301 and 311 are parts of a large photovoltaic package. The photovoltaic assembly 301 includes photovoltaic strips (e.g., strips 303A, 303B, and 303C, etc.) that are coupled to one another by buses 302A, 302B, and 302C. Similarly, photovoltaic assembly 311 includes a photovoltaic strips (e.g., strips 313A, 313B, etc.) that are coupled by buses 312A, 312B, and 313C. For example, the buses comprises electrically conductive material (e.g., metal material). It is to be appreciated that photovoltaic strips, which are typically made of silicon type of material, are often fragile. Thus smaller photovoltaic assemblies 301 and 311 are made and then connected together to form a large photovoltaic package. To connect photovoltaic assemblies 301 and 311, buses are connected. For example, buses 302A, 302B, and 302C are respectively connected to the buses 312A, 312B, and 312C. In an embodiment, a distance between the assemblies 301 and 311 when connected is based on the alignment of the concentrator member.

During the manufacturing process, which typically involves using one or more assembly lines, it is desirable to secure photovoltaic assemblies (e.g., photovoltaic assemblies 301 and 302) onto an assembly system. It is to be appreciated that in various embodiments of the invention, a system is provided to secure photovoltaic assemblies for manufacturing, storage, transporting, and others.

Figure 4:
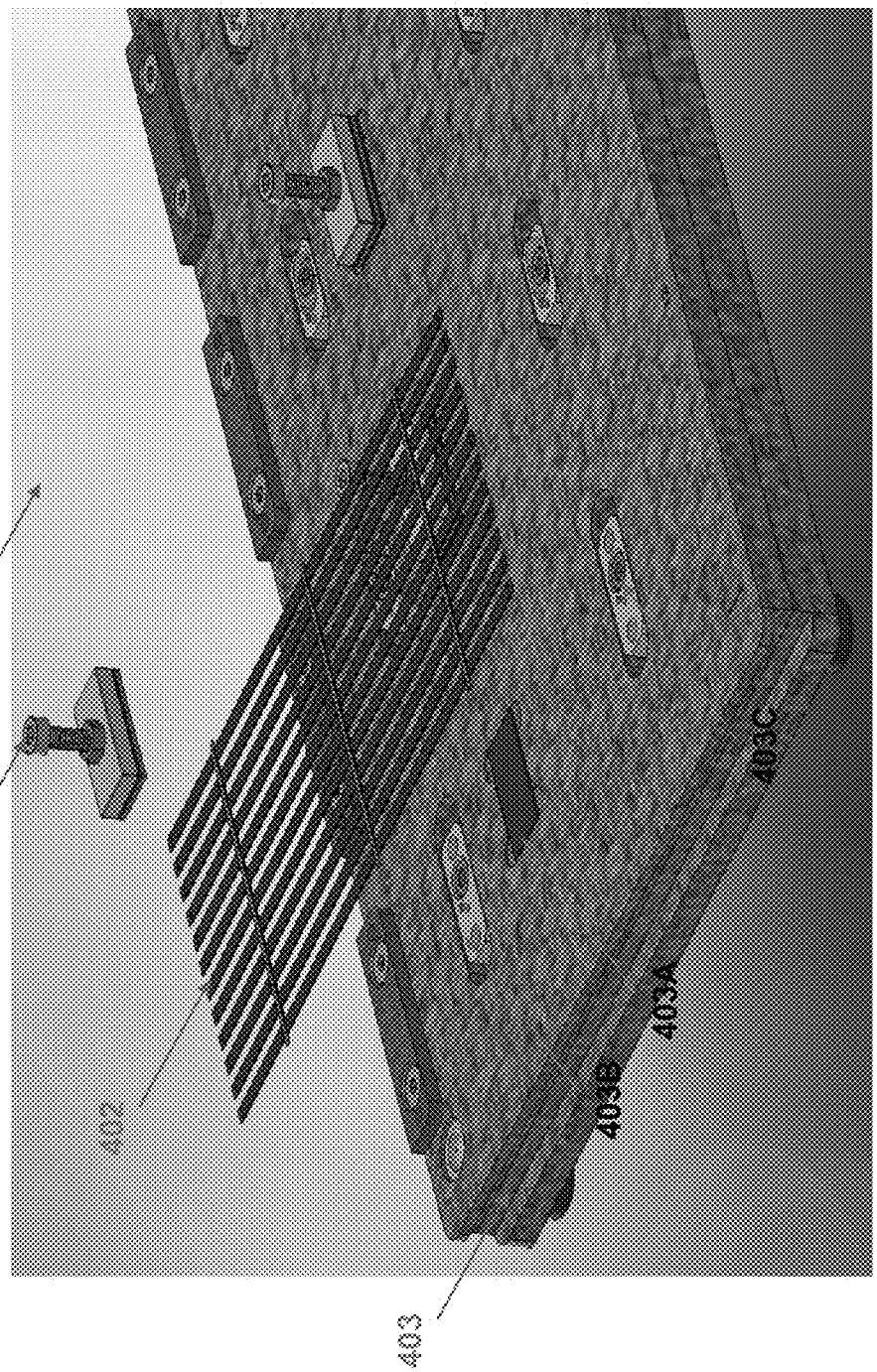
FIG. 4 is a simplified diagram illustrating a system for securing photovoltaic assemblies according to an embodiment of the present invention.

FIG. 4 is a simplified diagram illustrating a system for securing photovoltaic assemblies according to an embodiment of the present invention. This diagram is merely an example, which should not unduly limit the scope of the claims. One of ordinary skill in the art would recognize many variations, alternatives, and modifications. A system 400 in FIG. 4 includes an assembly plate 403 that is specifically configured to hold the photovoltaic assembly 402 (and other such photovoltaic assemblies). In various embodiments, the assembly plate 403 includes a tope plate and a bottom plate, as described below. The assembly plate 403 includes locator elements and a alignment members. As an example, locator element 403A is provided at a predetermined location to hold the photovoltaic assembly 402 with holding device 401. For example, the locator element 403A and the holding device 401 secure the photovoltaic assembly 402 by magnetic force. Depending on the application, either or both locator element 403A and the holding device 401 may include a magnet. For example, the locator element 403A may comprise a magnetic element. The holding device 401 may include a piece of magnetic element as well. In various embodiments, the holding device 401 includes a handle element that allows the holding device 401 to be easily placed onto or removed from the system 400.

The alignment members are used to make sure that the photovoltaic package 402 is held at a right position, which may be associated with a predetermined configuration. The predetermined configuration can be based on concentrator design, geometric, and/or manufacturing characteristics. For example, alignment members 403B and 403C are used to hold the photovoltaic assembly 402 in a right position. The positions of alignment members 403B and 403C are based on a predetermined configuration. Depending on the application, the alignment members may comprises material such as metal, plastic, and others.

Figure 5:
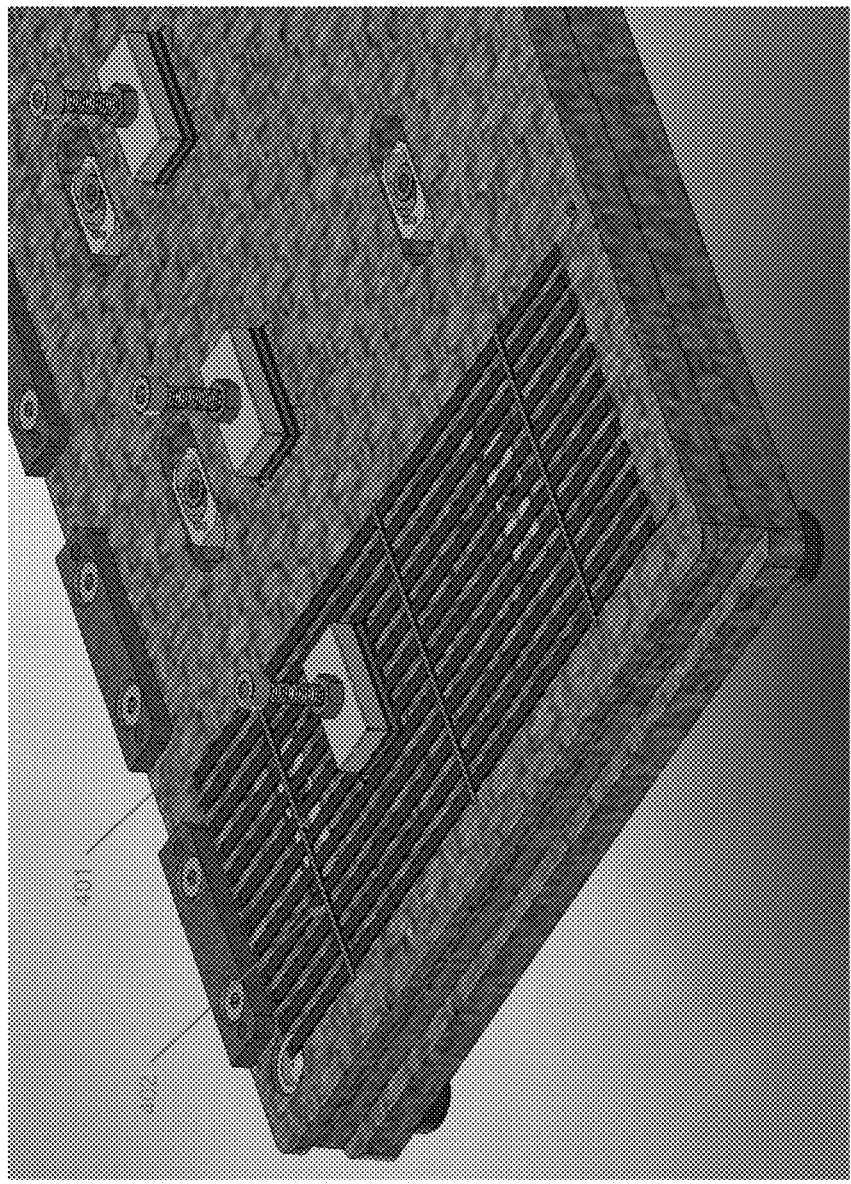
FIG. 5 is a simplified diagram illustrating a system for securing photovoltaic assemblies according to an embodiment of the present invention.

FIG. 5 is a simplified diagram illustrating a system for securing photovoltaic assemblies according to an embodiment of the present invention. This diagram is merely an example, which should not unduly limit the scope of the claims. One of ordinary skill in the art would recognize many variations, alternatives, and modifications. As shown in FIG. 5, the holding device 401 secures the photovoltaic assembly onto the assembly plate 403 by coupling to the locator element 403A (not shown in FIG. 5). In addition to being secured by the holding device 401, the photovoltaic assembly 402 is additionally set to by the predetermined position by the aligned member 403B and 403C. In an embodiment, the alignment member 403B and 403C each includes a protruding member that are positioned between selected two photovoltaic strips. For example, the protruding members both aligns the photovoltaic assembly 402 and prevent it from shifting while being secured by the holding member 401.

Figure 6:
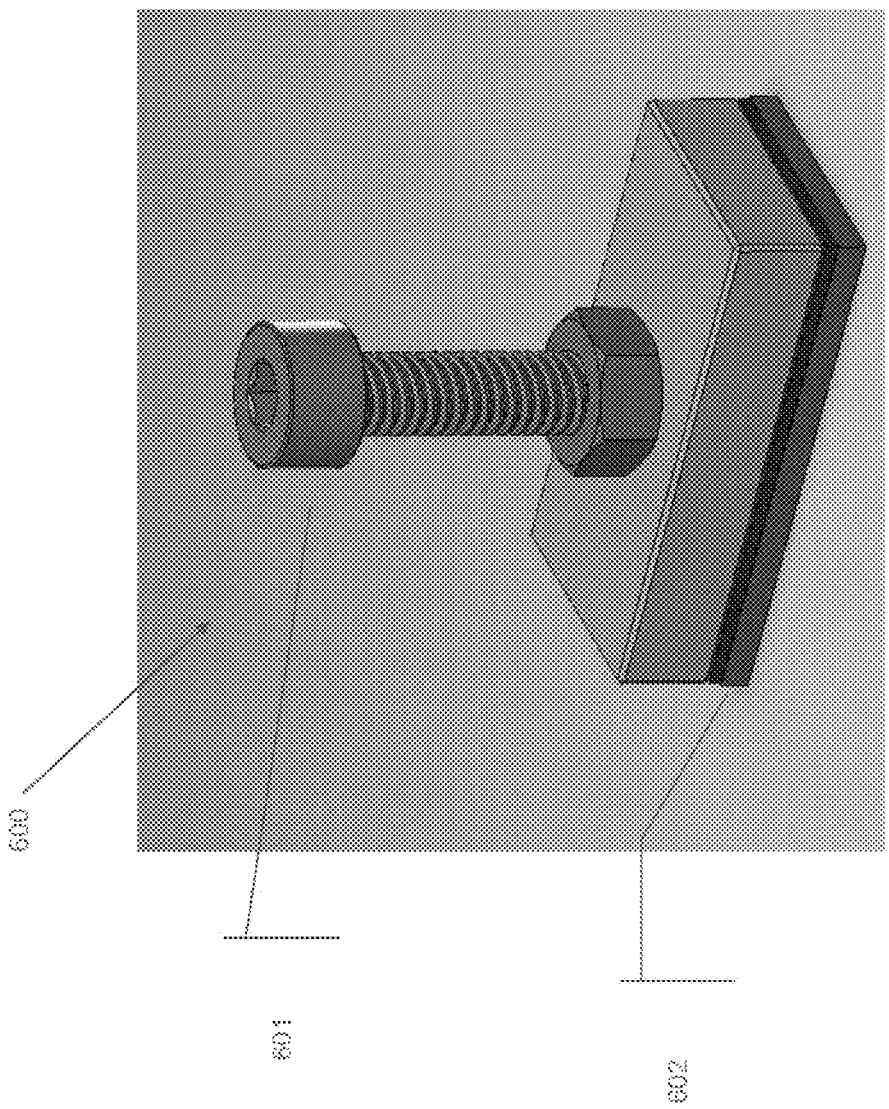
FIG. 6 is a simplified diagram illustrating a holding device according to an embodiment of the present invention.

FIG. 6 is a simplified diagram illustrating a holding device according to an embodiment of the present invention. This diagram is merely an example, which should not unduly limit the scope of the claims. One of ordinary skill in the art would recognize many variations, alternatives, and modifications. A holding device 600 includes a handle member 601 and a holding member 602. The handle member 601 as shown includes screw threads and a socket head (e.g., hex type). Among other things, the socket head allows the holding device 600 to be picked up easily. For example, a fork shape instrument with an opening smaller than the socket head can be used to pick up the holding device by holding onto the socket head. In an embodiment, handle member 601, which is a screw with a socket head, is screwed onto the holding member 602. The holding member 602 is specifically provided for coupling to locators on assembly plates (e.g., assembly plate 403 shown in FIG. 4). As described above, the holding member 602 may comprise a magnet. In various embodiments, the holding member 602 includes magnetite material that makes the holding member 602 magnetic. It is to be appreciated that the holding member 602 may includes other types of material as well. In certain embodiments, the holding member 602 is not magnetic.

Figure 7:
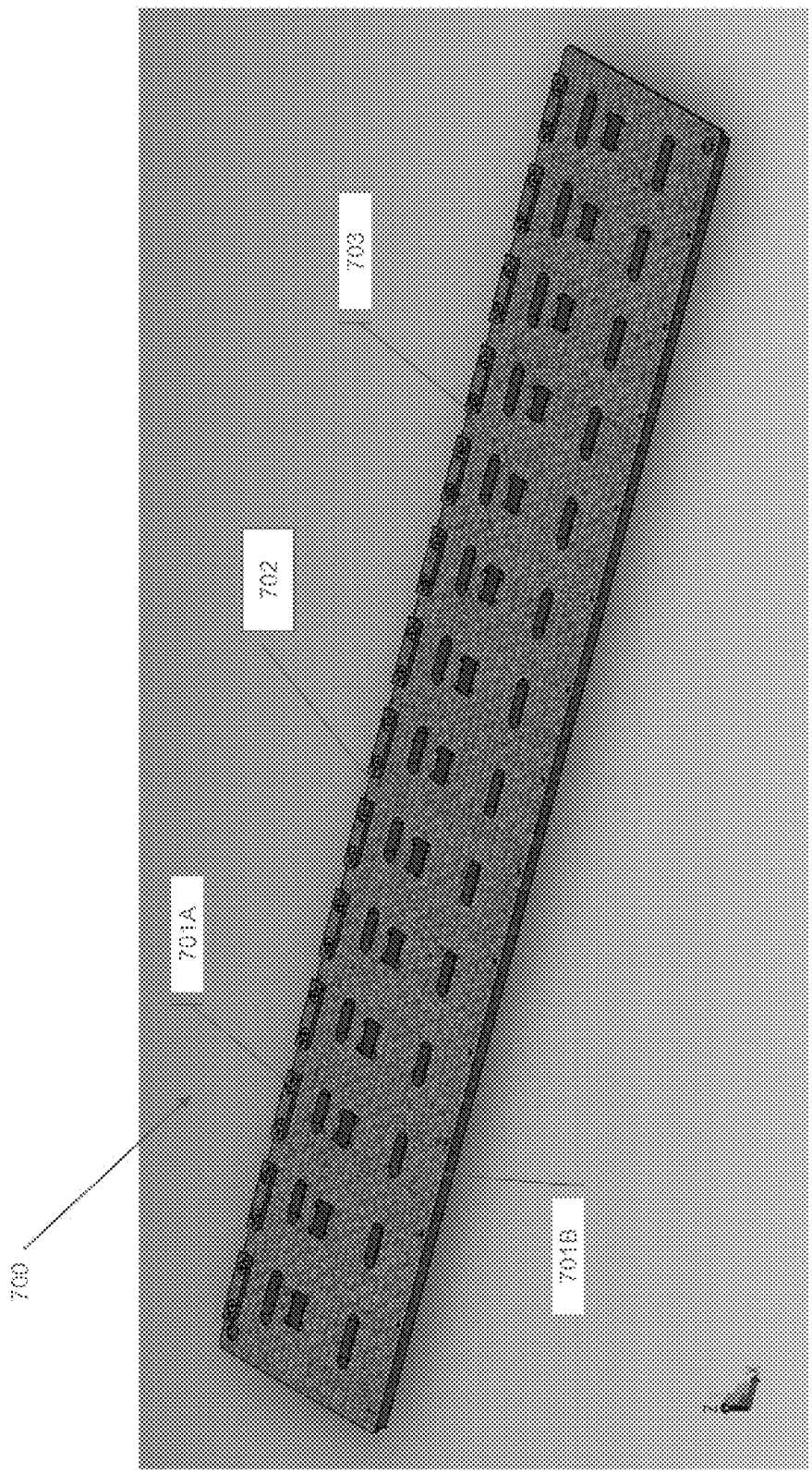
FIG. 7 is a simplified diagram illustrating a top plate member 700 according to an embodiment of the present invention.

The holding device 600, as an example, couples to locators on assembly plates (e.g., assembly plate 403). In various embodiments, an assembly plate comprises two piece: a top plate and a bottom plate. FIG. 7 is a simplified diagram illustrating a top plate member 700 according to an embodiment of the present invention. This diagram is merely an example, which should not unduly limit the scope of the claims. One of ordinary skill in the art would recognize many variations, alternatives, and modifications. The top plate member 700 includes a board 703. Depending on the application, the board 703 can be made from various types of materials, such as wood, plastic, metal, and others. The board 703 comprises a number of openings are that aligned and evenly spaced. In various embodiments, position, alignment, and size of the openings are based on size, geometry, and alignment of the concentrator and/or photovoltaic assemblies. For example, openings 701A and 701B are pair of openings configured to accommodate coupling elements of a base plate member, as described below.

A number of locator elements are on the board 703. Locator elements are for coupling to a holding device. For example, in FIG. 4, locator member 403A is to be coupled to the holding device 401. Similarly, each of locators elements on the board 703 can be coupled to a holding device. For example, locator 702 in FIG. 7 is to be coupled to a holding device. In an embodiment, the locator elements comprises magnetic material that allows them to be magnetically coupled to holding devices. For example, locator elements and the holding device may both have magnetic material. In some embodiments, holding devices comprise magnetic material while locator element do not have magnetic material. In various embodiments, the size, position, and alignment of the locator elements are based on size, geometry, configuration, and alignment of the concentrator and/or photovoltaic assemblies.

Figure 8:
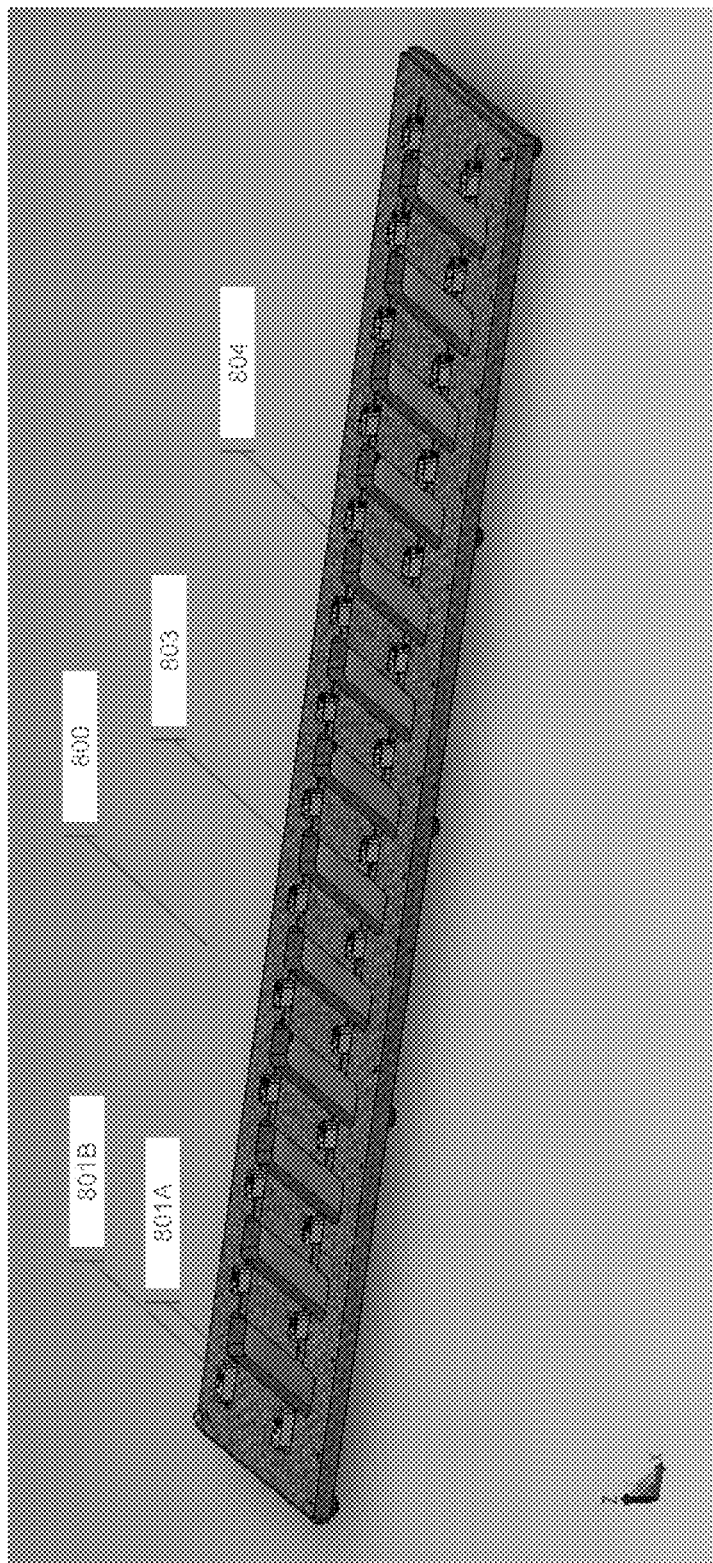
FIG. 8 is a simplified diagram illustrating a base plate member according to an embodiment of the present invention.

FIG. 8 is a simplified diagram illustrating a base plate member according to an embodiment of the present invention. This diagram is merely an example, which should not unduly limit the scope of the claims. One of ordinary skill in the art would recognize many variations, alternatives, and modifications. As shown in FIG. 8, a base plate member 800 includes a board 803. Depending on the application, the board 803 can be made from various types of materials, such as wood, plastic, metal, and others. The board 708 comprises a number of coupling elements are aligned and used for coupling the base plate 800 and the top plate 700. For example, coupling elements 801A and 801B are a pair of coupling elements that are aligned against a pair of openings of the top plate member 700. For example, the couple top plate member 700 and the base plate member 800, coupling elements of the base plate member are inserted into corresponding openings of the top plate member; to disengage the top plate member 700 and the base plate member 800, the couple elements are removed from the openings of the top plate member 700.

In certain embodiments, each of the coupling elements comprise a protruding element for securing photovoltaic packages. For example, coupling elements 801A and 801B each include a protruding element, and as a pair, the protruding elements are positioned between two photovoltaic strips as illustrated in FIG. 5.

In various embodiments, the alignment of the coupling elements is predetermined and based on alignment, size, and geometry of concentrator member and/or photovoltaic assembly. In addition, the size of the coupling elements can be different from the openings of the top plate member. More specifically, the coupling members have about the same width as the openings, but are shorter in length, thereby allowing the coupling members to shift along the length of the opening. For example, as shown in FIG. 5 where photovoltaic assembly 402 secured by holding device 401 and aligned by the coupling elements from the bottom plate. By shifting the positions where the coupling elements are inserted into the openings, spacing between the photovoltaic assembly 402 and its adjacent photovoltaic assembly can be adjusted. It is to be appreciated that there are other ways for making adjustments as well.

As shown in FIG. 8, the board 803 includes a number of openings (e.g., opening 804). For example, these openings reduce the weight of the base plate member, as some material is removed from the board.

Figure 9:
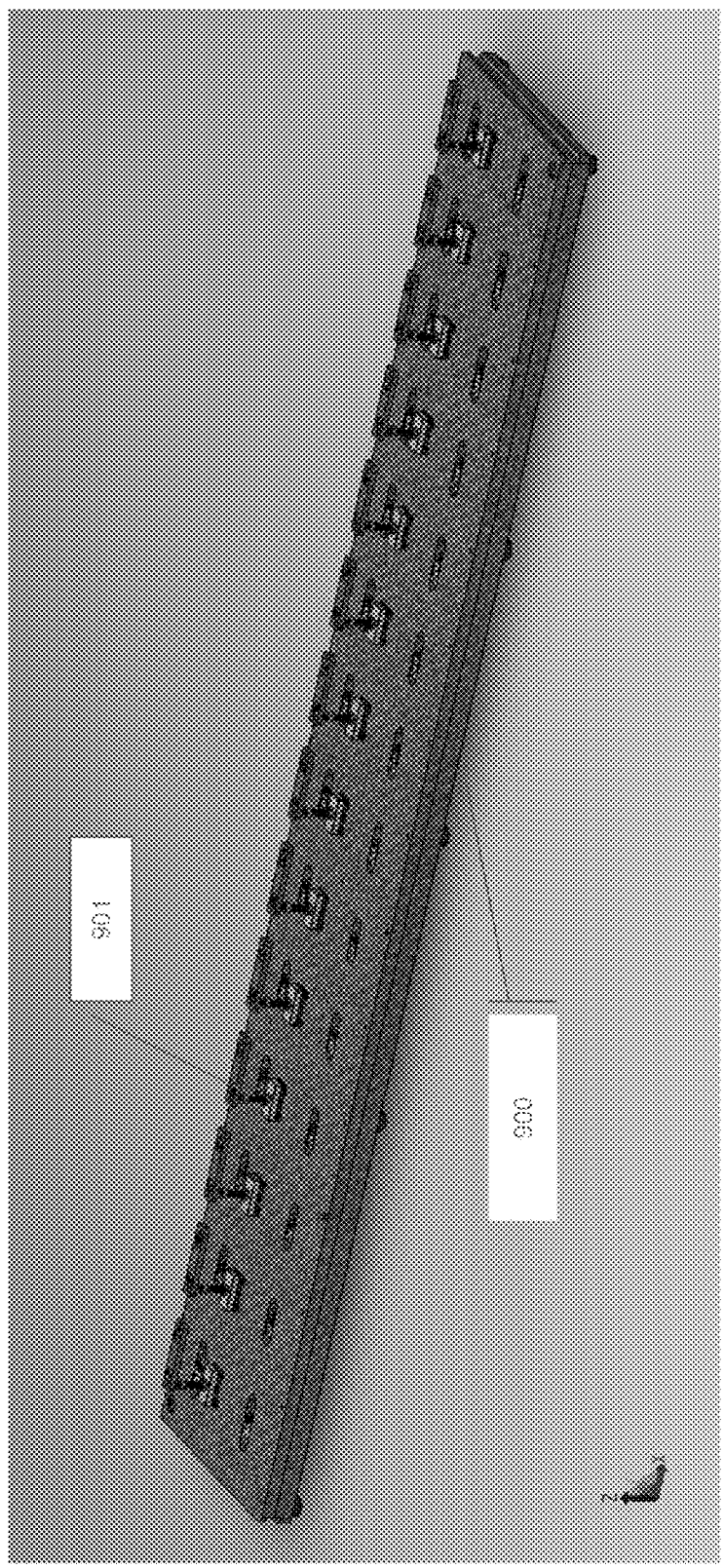
FIG. 9 is a simplified diagram illustrating an assembly system 900 according to an embodiment of the present invention.

FIG. 9 is a simplified diagram illustrating an assembly system 900 according to an embodiment of the present invention. This diagram is merely an example, which should not unduly limit the scope of the claims. One of ordinary skill in the art would recognize many variations, alternatives, and modifications. The assembly system 900 comprises a top plate member and a bottom plate member (e.g., top plate member 700 and bottom plate member 800). A number of holding devices (e.g., holding device 901) are provided to secure photovoltaic assemblies. That is, the holding devices hold the photovoltaic assemblies by using magnetic force to sandwich the assemblies by pressure from the magnetic force according to a specific embodiment. In various embodiments, the assembly system 900 can be readily loaded unto a production line for manufacturing photovoltaic modules. For example, photovoltaic assemblies are loaded onto the assembly system 900 and secured by the holding devices. After the photovoltaic assemblies are aligned, they are coupled to one another to form a large photovoltaic packages that is aligned against a concentrator.

In an embodiment, the present invention provides a method for manufacturing a concentrated photovoltaic module. The method includes the following steps:

1. providing a base plate member, the base plate member comprising a plurality of coupling members, the plurality of coupling members being spaced and aligned according to a first configuration;
2. providing a top plate member, the top plate member including a plurality of opening and a plurality of locator elements, the openings being spaced and aligned according to a second configuration;
4. determining positions for coupling the coupling members into the openings;
5. inserting the coupling members into the openings according to the positions;
6. providing a photovoltaic package, the photovoltaic assembly having a plurality of photovoltaic strips;
7. placing the photovoltaic assembly on a predetermine position on the top plate member;
8. providing a holding device; and
9. securing the photovoltaic assembly between the holding device and a first locator on the top plate member.

As an example, the method described above can be practiced using system 400 described above. Depending on the application, other steps may be performed. For example, a plurality of photovoltaic assemblies are secured onto the top plate member using the above method and then processed on an assembly line where other components (e.g., a concentrator module, substrate, etc.). Various steps can be added, removed, modified, replaced, rearranged, repeated, and/or overlapped, and should not limit the claims.

While the above is a complete description of specific embodiments of the invention, the above description should not be taken as limiting the scope of the invention as defined by the claims.

What is claimed is:

1. A method for manufacturing a photovoltaic panel, the method comprising:
    providing a base plate member, the base plate member comprising a plurality of coupling members, the plurality of coupling members being spaced and aligned for coupling the base plate member to a top plate member,
    the top plate member including a plurality of opening and a plurality of locator elements, the openings being spaced and aligned for coupling to the coupling members of the base plate member;
    determining positions for coupling the coupling members into the openings;
    inserting the coupling members into the openings according to the positions;
    providing a photovoltaic assembly, the photovoltaic assembly having a plurality of photovoltaic strips;
    placing the photovoltaic assembly on a predetermine position on the top plate member;
    providing a holding device; and
    securing the photovoltaic assembly between the holding device and a first locator on the top plate member.

2. The method of claim 1 wherein determining positions comprises determining an alignment of a concentrator member.

3. The method of claim 1 wherein the holding device and the first locator are magnetically coupled to each other.

4. The method of claim 1 further comprising aligning the photovoltaic assembly based a concentrator member.

* * * * *